United States Patent
Rearick et al.

(10) Patent No.: US 6,762,614 B2
(45) Date of Patent: Jul. 13, 2004

(54) SYSTEMS AND METHODS FOR FACILITATING DRIVER STRENGTH TESTING OF INTEGRATED CIRCUITS

(75) Inventors: Jeffrey R. Rearick, Fort Collins, CO (US); John G. Rohrbaugh, Fort Collins, CO (US); Shad Shepston, Firestone, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/125,338

(22) Filed: Apr. 18, 2002

(65) Prior Publication Data

US 2003/0197520 A1 Oct. 23, 2003

(51) Int. Cl.$^7$ .............................................. G01R 31/02
(52) U.S. Cl. ..................... 324/763; 324/765; 702/117; 714/733
(58) Field of Search ....................... 324/73.1, 763–769, 324/158.1; 702/117–118, 120–121, 124, 126, 189; 714/30, 733–741; 326/13–14, 30–34, 58, 83

(56) References Cited

U.S. PATENT DOCUMENTS

| | | | |
|---|---|---|---|
| 5,117,129 A | * | 5/1992 | Hoffman et al. .............. 326/13 |
| 5,682,392 A | | 10/1997 | Raymond et al. |
| 5,796,260 A | | 8/1998 | Agan |
| 5,977,775 A | | 11/1999 | Chandler et al. |
| 6,275,962 B1 | | 8/2001 | Fuller et al. |
| 6,324,485 B1 | | 11/2001 | Ellis |
| 6,365,859 B1 | | 4/2002 | Yi et al. |
| 6,396,279 B1 | | 5/2002 | Gruenert |
| 6,397,361 B1 | | 5/2002 | Saitoh |
| 6,448,865 B1 | * | 9/2002 | Miller .......................... 333/33 |
| 6,556,938 B1 | * | 4/2003 | Rohrbaugh et al. ......... 702/117 |
| 6,577,980 B1 | * | 6/2003 | Shepston et al. ........... 702/117 |
| 6,658,613 B2 | * | 12/2003 | Rearick et al. ............. 714/724 |

OTHER PUBLICATIONS

Haulin, Tord, " Built–in Parametric Test for Controlled Impedance I/Os," Ericsson Telecom, S–126 25 Stockholm, Sweden, pp. 123–128, (no month/year).

Niggemeyer, M. Ruffer, " Parametric Built–In Self Test of VLSI Systems," Laboratory for Information Technology, University of Hannover, Germany, (no month/year).

* cited by examiner

Primary Examiner—Minh N. Tang

(57) ABSTRACT

Integrated circuits (ICs) are provided. A representative IC includes a first pad that incorporates a first driver and a first receiver, with the first driver being configured to provide a first pad output signal to a component external to the IC, and the first receiver being configured to receive a first pad input signal from a component external to the IC. A first test circuit also is provided that is internal to the IC. The first test circuit is adapted to provide information corresponding to the driver strength of the first pad. Systems, methods, computer-readable media and other ICs also are provided.

9 Claims, 11 Drawing Sheets

US 6,762,614 B2

SYSTEMS AND METHODS FOR FACILITATING DRIVER STRENGTH TESTING OF INTEGRATED CIRCUITS

BACKGROUND OF THE INVENTION

1. Field of the Invention

The present invention generally relates to integrated circuits and, in particular, to systems and methods for facilitating, within an integrated circuit, driver strength testing of pads of the integrated circuit.

2. Description of the Related Art

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing ICs, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and/or other shortcomings of the prior art.

SUMMARY OF THE INVENTION

Briefly described, the present invention provides driver strength testing functionality within integrated circuits. In this regard, some embodiments of the present invention may be construed as providing integrated circuits (ICs). In one such embodiment, the integrated circuit includes a first pad electrically communicating with at least a portion of the IC. The first pad includes a first driver and a first receiver, with the first driver being configured to provide a first pad output signal to a component external to the IC. The first receiver is configured to receive a first pad input signal from a component external to the IC and provide, to a component internal to the IC, a first receiver digital output signal in response to the first pad input signal. A first test circuit also is provided that is internal to the IC. The first test circuit is adapted to provide information corresponding to the driver strength of the first pad.

Some embodiments of the present invention may be construed as providing systems for measuring the current drive strength of drivers of an integrated circuit. In this regard, one such system includes an IC and Automated Test Equipment (ATE). The ATE is configured to electrically interconnect with the IC and provide at least one stimulus to the IC. The IC includes a first pad that incorporates a first driver, a first receiver, and a first test circuit. The first test circuit electrically communicates with the ATE so that, in response to receiving at least one stimulus from the ATE, the first test circuit provides information corresponding to the driver strength of the first driver to the ATE.

Some embodiments of the present invention may be construed as providing methods for testing an IC. In this regard, one such method includes the steps of: electrically interconnecting ATE with the IC; providing at least one stimulus to the IC such that the IC measures a driver strength of the first pad; and receiving information corresponding to the driver strength of the first pad.

Other embodiments of the present invention may be construed as providing computer-readable media. In this regard, one such computer readable medium, which incorporates a computer program for facilitating measurements of driver strength of the drivers of an IC, includes logic configured to enable ATE to provide at least one stimulus to the IC. Additionally, logic configured to enable the ATE to receive information corresponding to the driver strength of a first driver of the IC is provided.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION

Figure 1:
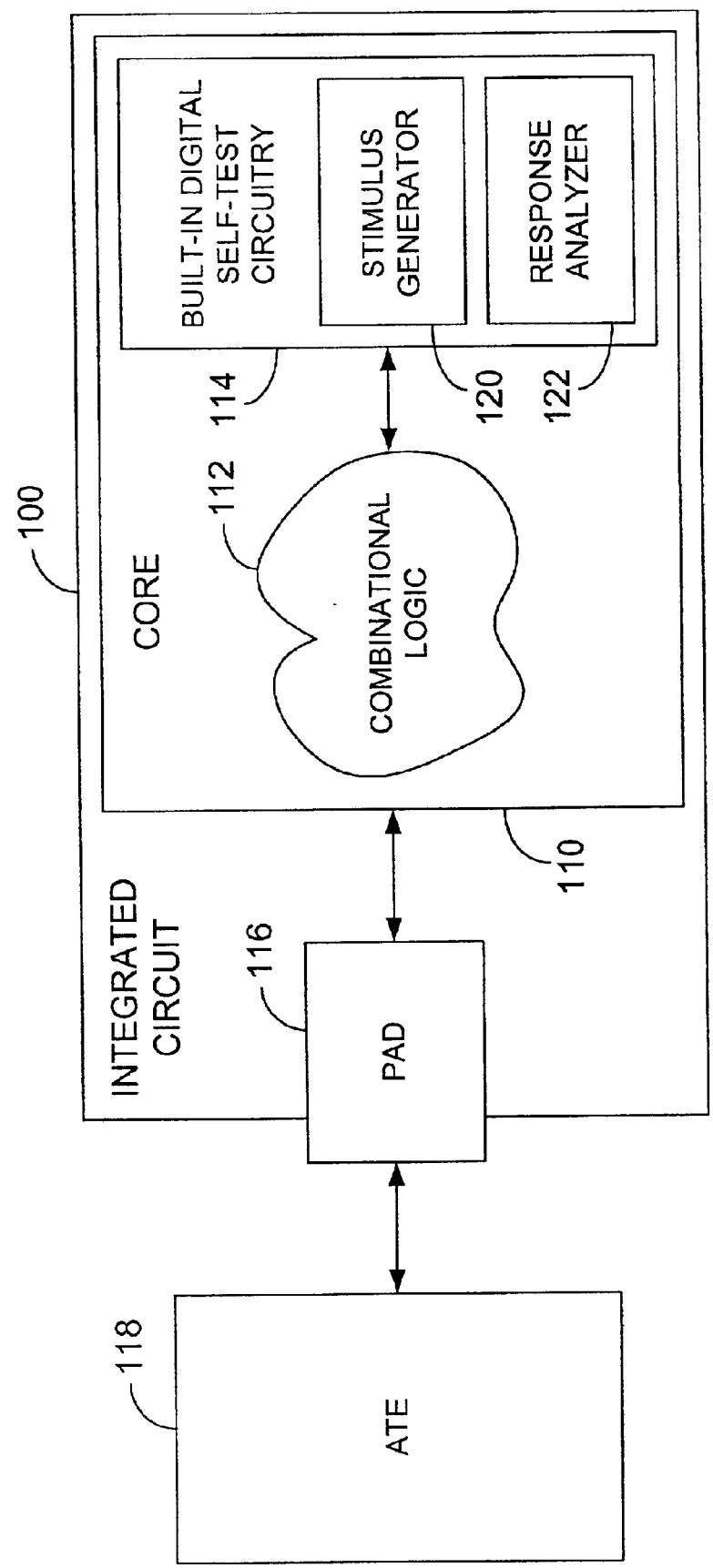
FIG. 1 is a schematic diagram depicting a representative integrated circuit incorporating digital self-test circuitry of the prior art.

Reference will now be made in detail to the description of the invention as illustrated in the drawings with like numerals indicating like parts throughout the several views. As mentioned briefly hereinbefore, it is known to incorporate built-in (digital) self-test circuitry into an integrated circuit. Referring now to FIG. 1, a representative integrated circuit 100 incorporating such built-in self-test circuitry will be described in greater detail, so as to facilitate a more thorough understanding of the present invention.

As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry are comprised of digital data, i.e., zeros and ones. In response to the various patterns, the logic circuitry under test then provides a response signal or signals to the response analyzer 122 that is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Figure 2:
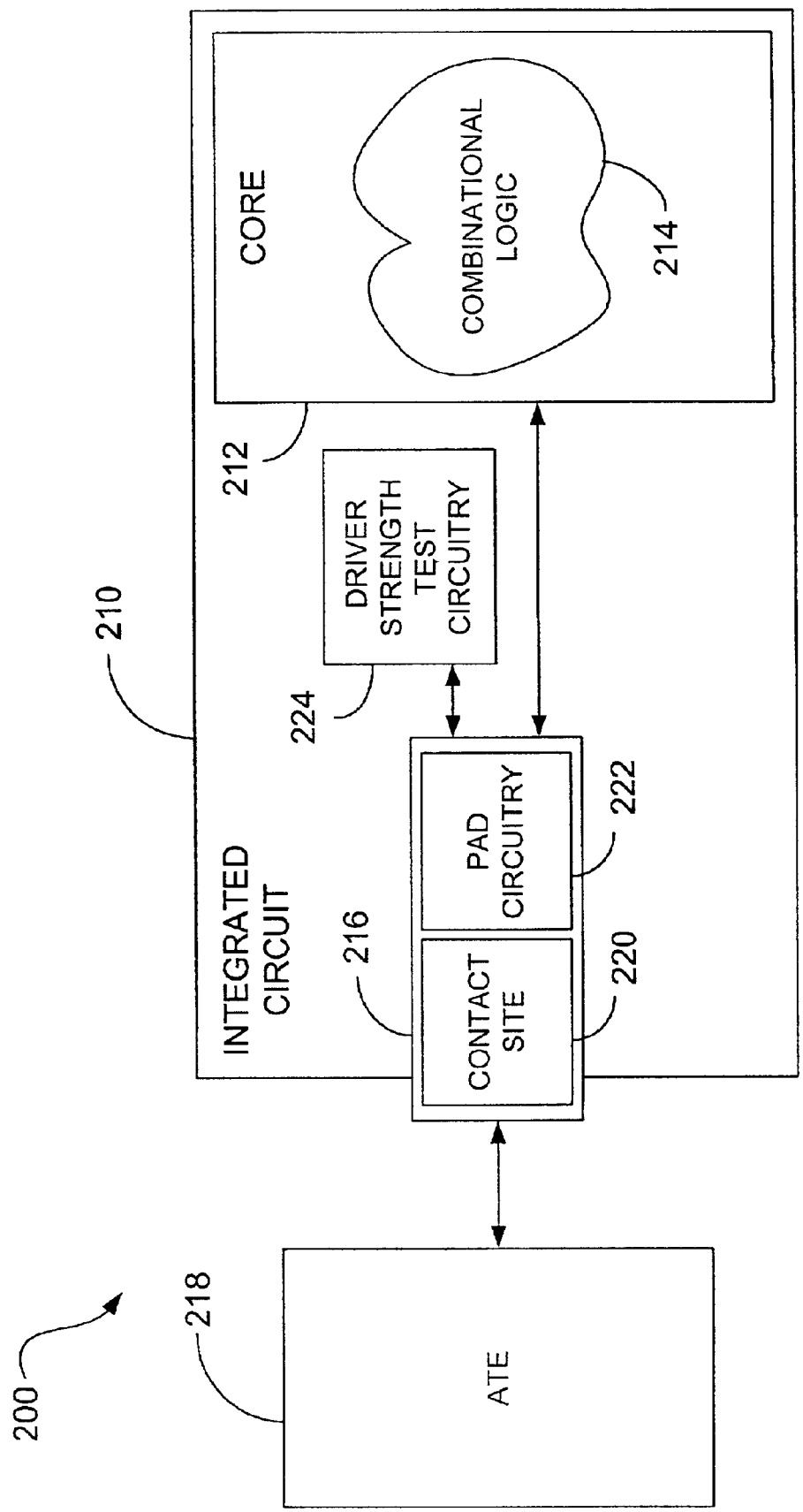
FIG. 2 is a schematic diagram depicting an embodiment of a test system of the present invention.

Utilizing the digital self-test circuitry of FIG. 1 as a point of comparison, general characteristics of an embodiment of the driver strength test system of the present invention will now be described with reference to the schematic diagram of FIG. 2. As depicted in FIG. 2, driver strength test system 200 incorporates an integrated circuit 210 that includes a core 212. Core 212 incorporates logic 214 and electrically communicates with a pad 216, which is configured to allow intercommunication of the logic with devices, such as ATE 218, for example, external to the integrated circuit. As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates driver strength test circuitry 224 that electrically communicates, either directly or indirectly, with pad 216. As described in detail hereinafter, driver strength test circuitry 224 is configured to provide selected ATE functionality and, thereby, potentially reduces the necessity for specialized external automated test equipment for testing integrated circuits of various configurations. It should be noted that, although driver strength test circuitry 224 is depicted in FIG. 2 as residing outside core 212 and outside the pad 216, various other arrangements of test circuitry 224 may be utilized, such as arranging the test circuitry within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing driver strength test circuitry "on-chip," the testing of integrated circuits, such as integrated circuit 210, may be implemented utilizing conventional ATE, whereby test capability not typically provided by the conventional ATE may be provided by the driver strength test circuitry. So provided, the driver strength test circuitry has the ability to provide testing capability that a given ATE does not provide, or is not able to provide, while utilizing various capabilities that a given ATE does provide. Thus, testing systems 200 of the present invention may facilitate efficient and effective testing of integrated circuits that draws from at least some of the inherent strengths of conventional ATE, e.g., reduced costs, while providing potentially improved testing performance.

By utilizing the driver strength test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the driver strength test circuitry. Additionally, utilization of the driver strength test circuitry makes it possible to test the integrated circuits at frequencies greater than the test frequency limit of the ATE.

Figure 3:
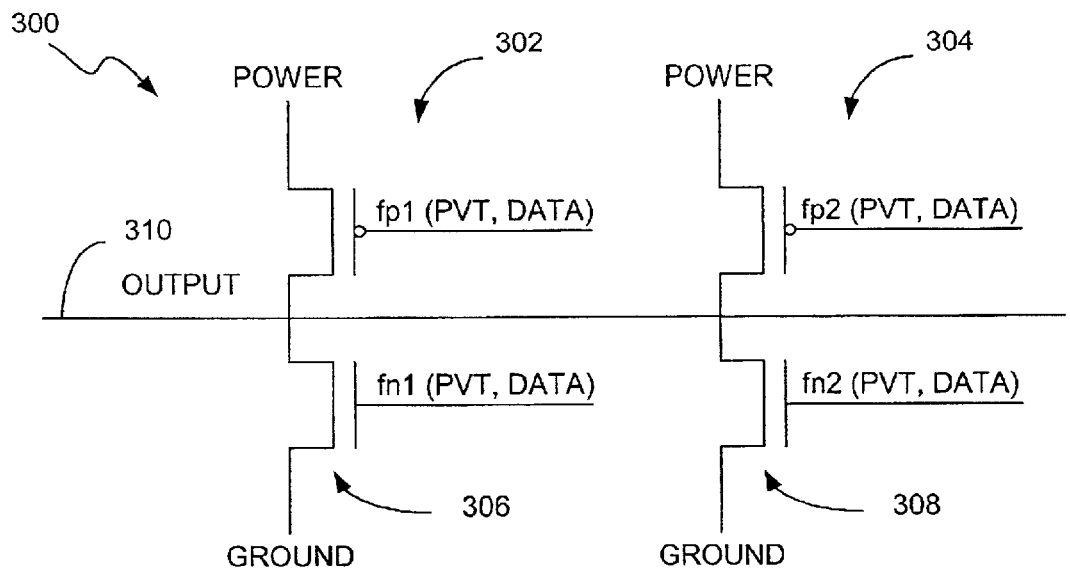
FIG. 3 is a schematic diagram depicting detail of an embodiment of a driver circuit.

As mentioned hereinbefore, the present invention facilitates driver strength testing of pads of integrated circuits and, in some embodiments, facilitates such testing, at least in part, with the use of "on-chip" components. In this regard, typical pad driver circuits are implemented with several parallel transistors that can pull the pad up to the power supply (logic "1"), and several parallel transistors that can pull the pad down to ground (logic "0"). In CMOS processes, P-type transistors are usually used to pull up to the positive power supply, and N-type transistors are usually used to pull down to ground. The use of parallel transistors allows not only greater drive strength, but also the tuning of drive strength based on control circuits that are sensitive to process, voltage, and temperature (PVT). Additionally, it is common practice to qualify the driver data with one of several bits of PVT information for each pullup and pulldown transistor in the driver, as shown in FIG. 3. These PVT signals are generated centrally and distributed around the IC to each pad.

In FIG. 3, pad driver circuit 300 includes two P-type transistors 302 and 304, and two N-type transistors 306 and 308. The transistors 302 and 304 each are coupled between a respective power source and output 310. The transistors 306 and 308 each are coupled between a ground and output 310.

To assure the proper fabrication and operation of a pad driver circuit, the output drive current should be measured. This is often called a "driver strength test." Driver circuits can be defective in either direction (pullup or pulldown). Thus, a driver strength test typically consists of two portions, i.e., one measuring and/or verifying the current of the pullup device(s) and another measuring and/or verifying the current of the pulldown device(s).

Typically, current systems are measured by automated test equipment (ATE) systems that employ ammeters in parametric measurement units (PMUs) that can be connected to a pad to verify that the drive current is above a specified lower limit. Unfortunately, as mentioned before, for ICs with pin counts that exceed the number of available tester channels, ATE cannot be used to measure drive currents on all pads. The subset of pads that are contacted by the ATE can be tested, but that technique leaves many other pads untested, risking undetected defects. The present invention potentially solves this problem by providing test circuitry on-chip, e.g., providing measurement circuitry within the driver circuit to enable verification that driver strength meets a specification to a certain degree of accuracy.

Figure 4:
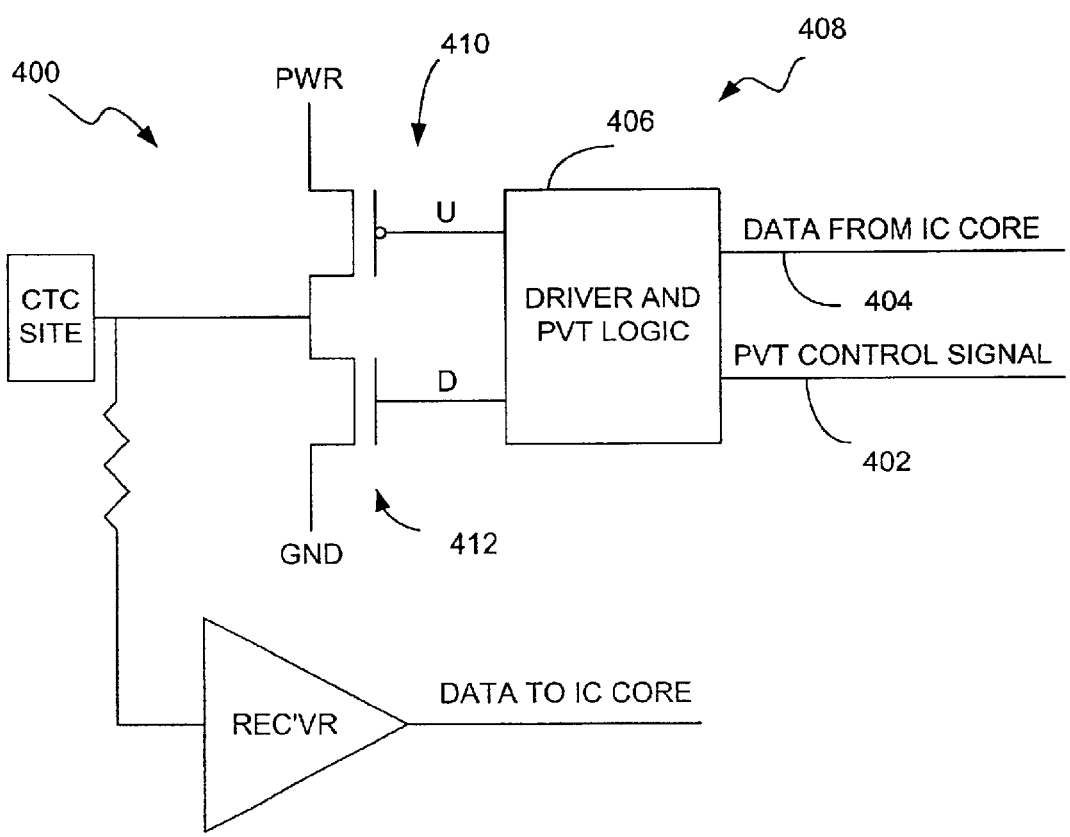
FIG. 4 is a schematic diagram depicting detail of an embodiment of a driver circuit.

A representative pad 400 that includes a driver and receiver is shown in FIG. 4. As shown in FIG. 4, PVT signals 402 and the individual driver data 404 are combined in a logic circuit 406 that resides inside each driver circuit 408. The logic circuit generates individual "up" and "down" signals that drive the gates of the output transistors 410 and 412.

Figure 5:
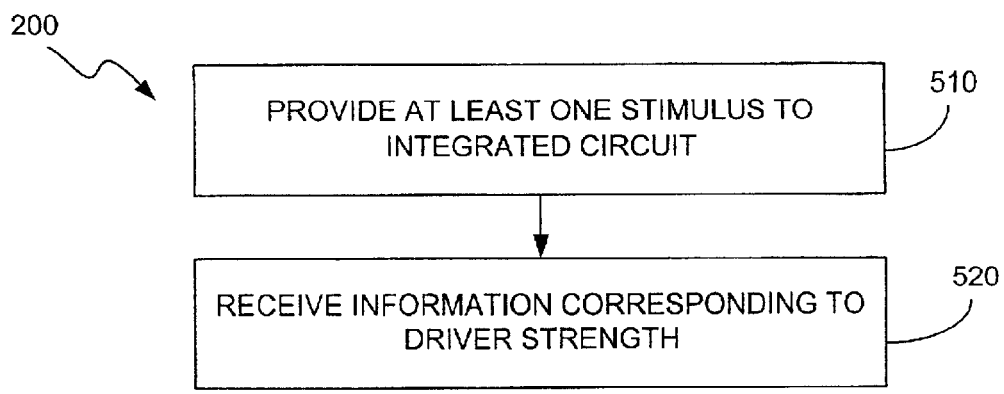
FIG. 5 is a flowchart depicting the functionality of an embodiment of the test system of FIG. 2.

Reference will now be made to the flowchart of FIG. 5, which shows the functionality and/or operation of an implementation of the test system of the present invention. As shown in FIG. 5, the test system or method 200 may be construed as beginning at block 510, where at least one stimulus is provided to an IC. In block 520, information corresponding to the drive strength of a driver of the IC is received.

Figure 6A:
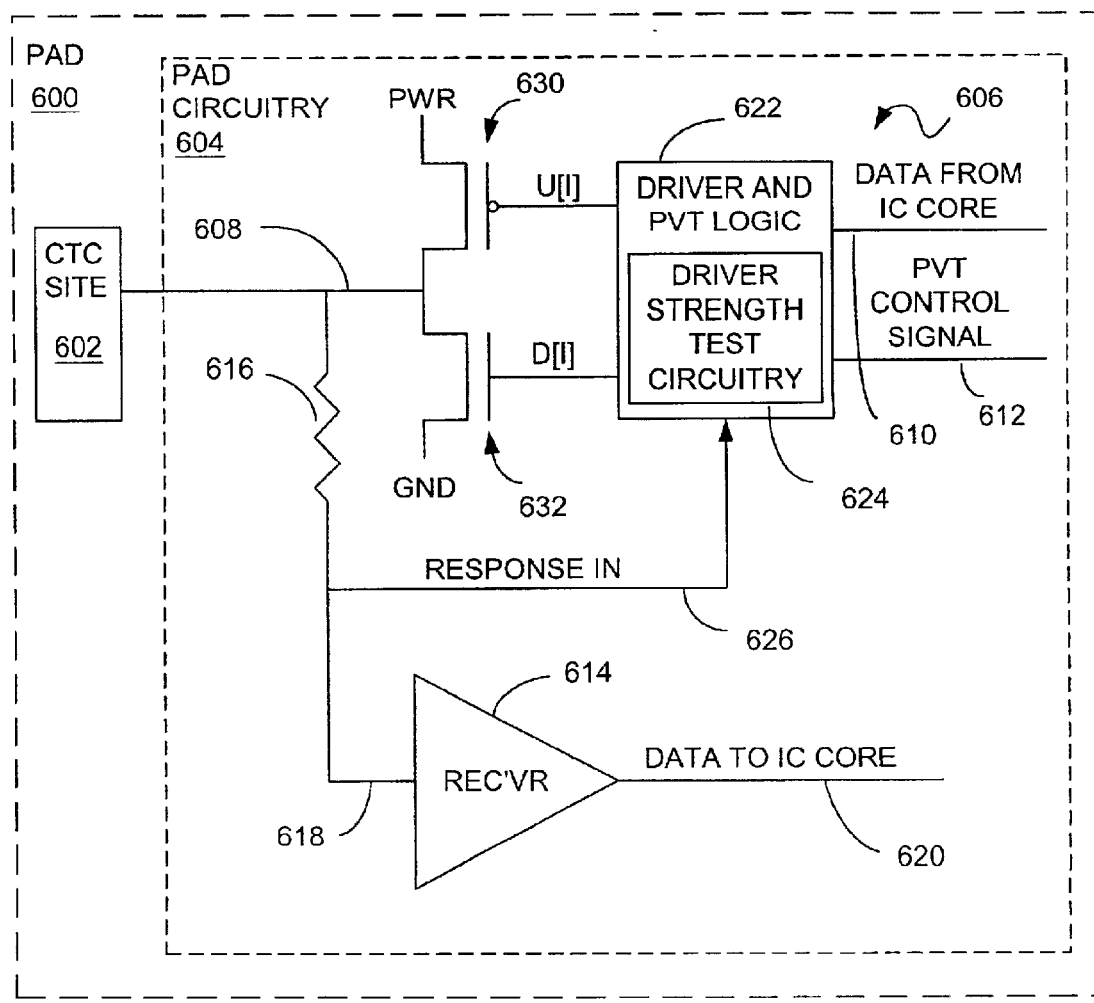
FIG. 6A is a schematic diagram of an embodiment of a pad of the present invention.

Reference will now be made to FIG. 6A, which depicts an embodiment of an integrated circuit of the present invention. As shown in FIG. 6A, a pad 600 of an integrated circuit includes both a contact site, e.g., contact site 602, and pad circuitry associated with the contact site, e.g., pad circuitry 604. Circuitry 604 includes a driver 606 that electrically communicates with the contact site 602, such as by lead 608. Driver 606 is configured to receive a data signal 610 from the IC core, a PVT control signal 612, and a driver tristate enable signal (not shown) from the IC core. Driver 606 also is electrically interconnected to a receiver 614 with an optional resistor 616 being coupled therebetween. Receiver 614 is configured to receive an input, such as via lead 618, and is configured to provide an output, such as via lead 620, to the IC core of the integrated circuit.

As mentioned before, driver 606 includes driver and PVT logic 622 as well as driver strength test circuitry 624. Additionally, driver 606 includes one or more P-type transistors 630 and one or more N-type transistors 632. Driver response 626 ("response in") is provided to the driver strength test circuitry 624. The driver strength test circuitry 624 is described in detail in FIG. 6B.

Figure 6B:
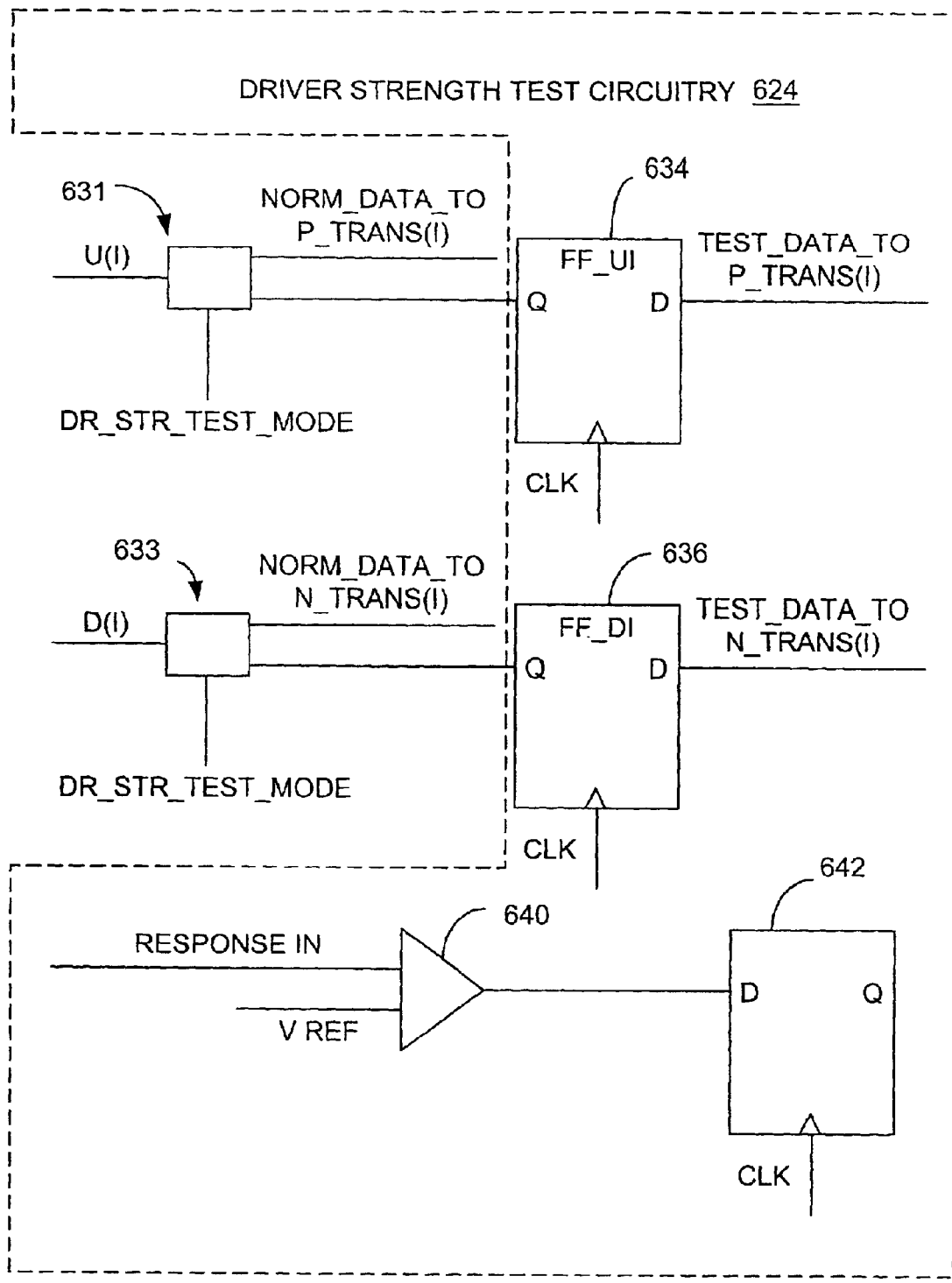
FIG. 6B is schematic diagram of an embodiment of driver strength test circuitry of the present invention.

As shown in FIG. 6B, the gate of each transistor in the driver is connected to an output (U[I] for p-type transistors and N[I] for n-type transistors) of the driver strength test circuitry 624. These signals are produced by mutiplexers 631 and 633, which select between the normal driver data and the test driver data based on the control signal DR_STR_TEST_MODE. The source of the test driver data for each transistor in the driver can be a scan register, as shown. In particular, control signal U[I] is driven by multiplexer 631 which communicates with scan register 634, and control signal D[I] is driven by multiplexer 633 which communicates with scan register 636. A comparator 640 receives an output of the pad driver as well as a reference voltage VREF, and provides a data signal to a scan register 642.

Using the representative embodiment of the driver strength test circuitry of FIGS. 6A and 6B, driver strength for pullup current may be obtained by selecting a p-transistor (or set of p-transistors) in a given driver. An n-transistor (or set of n-transistors) of the same driver, the resistance of which is greater than that of the p-network by a specified margin, also is selected. Data is then scanned into the scan registers of the test circuitry that will activate the chosen transistors. By setting the dr_str_test mode signal to a "1," the drivers can be controlled by the scan registers of the test circuitry. The voltage of the output node then can be compared with a reference voltage (VREF in this example). The output of the comparator then can be scanned into scan register 642 and the output observed (should be a logic "1" in this example).

Similarly, a driver strength for pulldown current may be obtained by selecting an n-transistor (or set of n-transistors) in a given driver. A p-transistor (or set of p-transistors) in the same driver, the resistance of which is greater than that of the n-network by a specified margin, also is selected. Data is then scanned into the scan registers of the test circuitry that will activate the chosen transistors. The dr_str_test_ mode signal is set to a "1" to cause the drivers to be controlled by the scan registers in the test circuitry. The voltage of the output node then can be compared with a reference voltage (VREF in this example). The output of the comparator then can be provided to scan register 642 and observed (should be a logic "0" in this example).

The aforementioned tests can be repeated as desired with any subset and/or combination of n- and p-transistors. The range of output voltages should allow characterization of the strength of each target transistor with respect to the available opposing transistor(s).

In some implementations, the driver and PVT logic circuitry inside each pad are combined with the test multiplexers. A "dr_str_test_mode" control (see FIG. 6C) then can be used to force the driver into test mode. In this mode, the PVT control signals act as the test data for each transistor, thus reducing or eliminating the need for the scan registers for the test data. This can result in the circuit having much lower area penalty. Some additional logic and/or scan registers may be required depending on the degree of flexibility desired for activating combinations of n- and p-transistors.

Figure 6C:
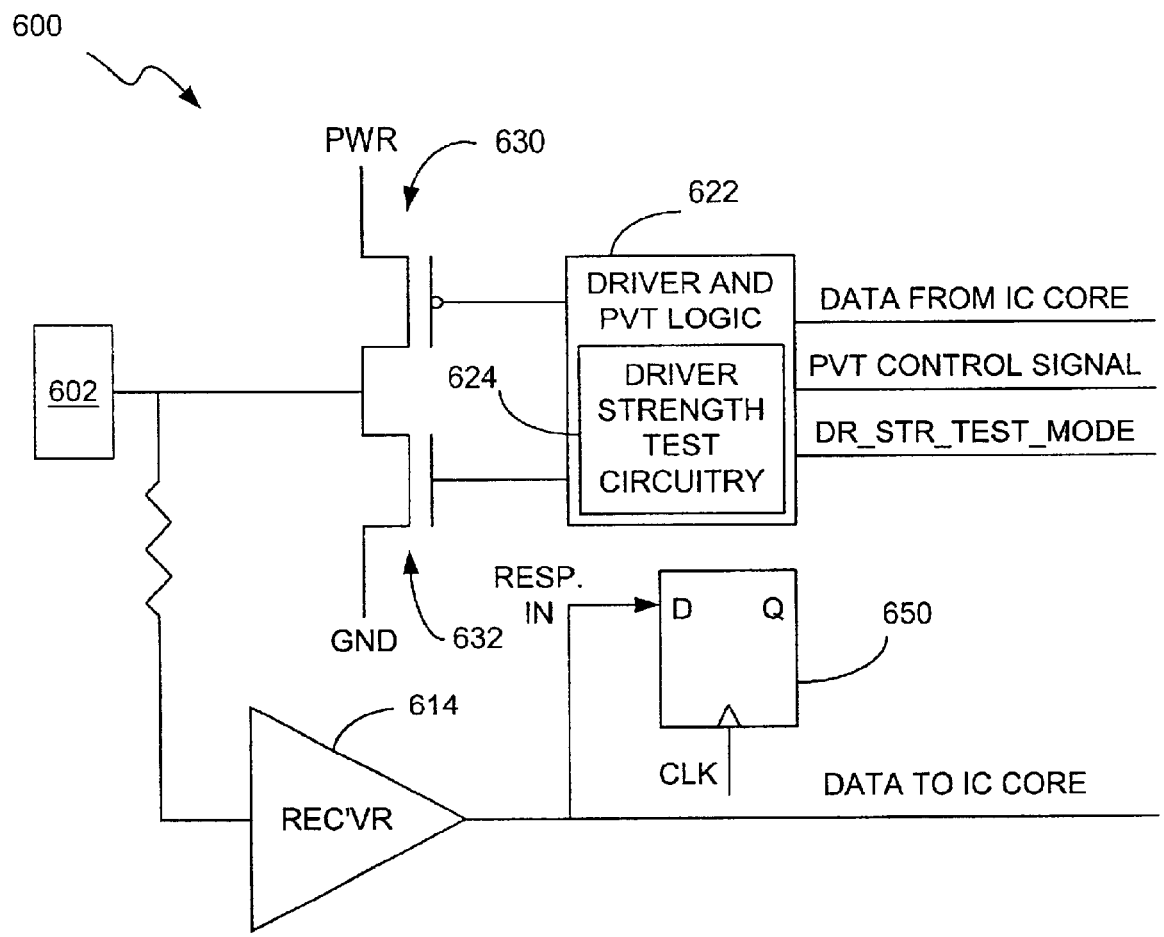
FIG. 6C is a schematic diagram depicting another embodiment of a pad of the present invention.

Also in some implementations, such as depicted in FIG. 6C, the receiver circuit, e.g., receiver 614, associated with the driver circuit can be used as the comparator so as not to incur any additional area penalty. In this configuration, the scan register, e.g., scan register 650, associated with the receiver can be used to capture the receiver output. Since each receiver typically has its own scan register (as per IEEE standard 1149.1), all the pads can be tested simultaneously. Such a use of the existing scan register also minimizes the area penalty by eliminating the need for a dedicated comparator (640) and scan register (642) as shown in FIG. 6B. However, this implementation relies on the fixed threshold of the receiver (usually near VDD/2) to distinguish logic 0 from logic 1.

Since the nature of a pad driver is to either drive high or drive low, but not both at the same time, pad designs may require extra logic to support at least some embodiments of the invention. Alternatively, one proposed change to the test environment can be made to allow pairs of pads to be tested with relatively little change to the pad circuitry, as shown in FIG. 6D.

Figure 6D:
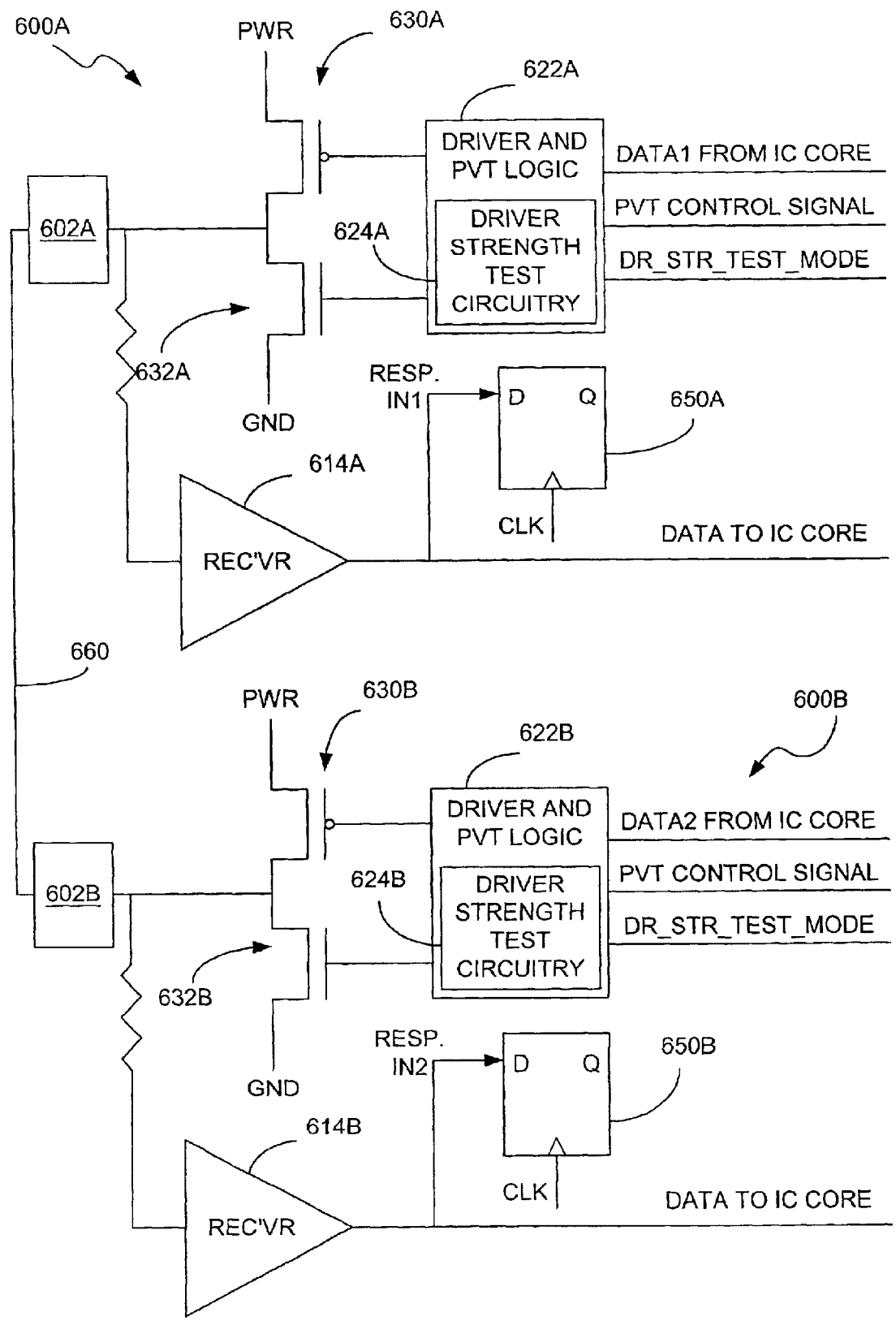
FIG. 6D is a schematic diagram depicting electrically intertwined pads of an embodiment of the present invention.

In FIG. 6D, two pads, e.g., pads 600A and 600B, of the same circuit type are connected externally with a jumper wire 660. An inter-pad driver strength for pullup current can then be obtained by selecting a p-transistor (or set of p-transistors) in a given driver. An n-transistor (or set of n-transistors) in the jumpered driver also is selected, the resistance of which is greater than that of the p-network by a specified margin. Data is then scanned into the scan registers in the test circuitry that will activate the chosen transistors. The dr_str_test_mode signal can be set to a "1" to cause the drivers to be controlled by the scan registers in the test circuitry. The voltage of the output nodes then can be compared with a reference voltage (VDD/2 in this example). The outputs of the comparators can be sampled into scan registers and observed (should both be logic "1" in this example).

An inter-pad driver strength for pulldown current can be obtained by selecting an n-transistor (or set of n-transistors) in a given driver. A p-transistor (or set of p-transistors) in the jumpered driver is also selected, the resistance of which is greater than that of the n-network by a specified margin. Data is then scanned into the scan registers in the test circuitry that will activate the chosen transistors. The dr_str_test_mode signal is set to a "1" to cause the drivers to be controlled by the scan registers in the test circuitry. The voltages of the output nodes then can be compared with a reference voltage (VDD/2 in this example), and the outputs of the comparators can be sampled into scan registers and observed (should both be logic "0" in this example).

Since driver strength testing can cause logic contention, driver design should be done with care to assure that the high currents involved do not cause damage to the circuitry. As a cautionary measure, the jumper wire described with respect to FIG. 6D can be replaced with current limiting resistor. Note that the calculations for the output voltages at pad 600A and pad 600B nodes should take this resistance into account in order to predict the correct results.

Note that in the some implementations, the trip level of the receiver is generally fixed at VDD/2, which could limit the number of data points from logic contentions that can be gathered compared to the more general comparator solution. One easily-implemented extension to the preferred implementation is the use of a receiver with hysteresis that extends the range of voltage levels that can be used in resolving contentions between other combinations of p- and n-transistors.

When an IC has a high pin count, it is overwhelmingly likely that there are many occurrences of the same pad driver circuit type used for different signals. The present invention can make use of that fact to assess the accuracy of the driver strength measurement circuit. If one signal connected to a given pad driver circuit type is contacted by ATE, the PMU can be used to accurately measure the current sourcing and sinking abilities of the pullup and pulldown transistors, respectively. These values will be largely identical for all other copies of this pad type, subject only to the variation of the IC process, which tends to be small in any given area of the circuit. Thus, for a group of pad driver circuits of a given type that are near each other in the circuit, the measurement of one ATE-contacted member can be used to reliably infer the values for the other non-contacted members, thereby allowing the pass/fail results from the scan registers sampling the pad voltages of non-contacted pads to represent actual current specification values.

Figure 7:
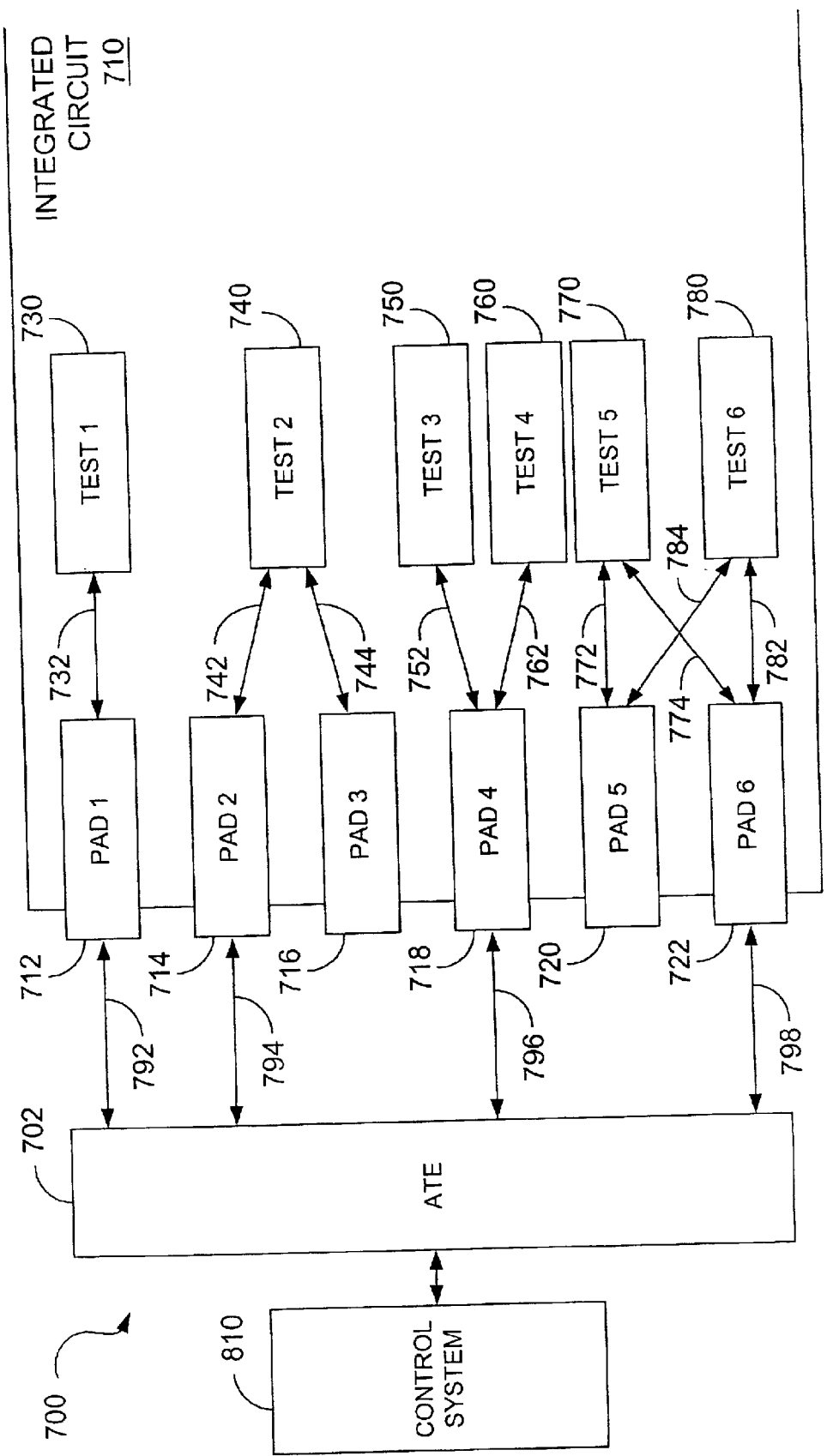
FIG. 7 is a schematic diagram depicting an alternative embodiment of the present invention.

Referring now to FIG. 7, various aspects of the present invention, including driver strength test circuitry implementation and calibration will now be described in greater detail. As shown in FIG. 7, an embodiment 700 of the present invention incorporates an integrated circuit 710 which includes multiple pads. In particular, integrated circuit 710 includes pads 1 through 6 (712, 714, 716, 718, 720 and 722, respectively). As depicted in FIG. 7, the integrated circuit also incorporates various driver strength test circuits, such as Test 1 (730), Test 2 (740), Test 3 (750), Test 4 (760), Test 5 (770) and Test 6 (780). The various driver strength test circuits electrically communicate with their respective pads in a variety of configurations. For instance, circuitry 730 communicates directly with pad 712 via transmission path 732 (in a some implementations, path 732 may be two unidirectional paths); circuitry 740 communicates with each of pads 714 and 716 by utilizing transmission paths 742 and 744, respectively; circuitry 750 and circuitry 760 each electrically communicate with pad 718 via transmission paths 752 and 762, respectively; circuitry 770 communicates with pads 720 and 722 via transmission path 772 and 774, respectively; and circuitry 780 also communicates with pads 720 and 722, albeit, via transmission path 782 and 784, respectively. Thus, an integrated circuit may incorporate various pad types as well as various configurations of intercommunication between the various pads and various driver strength test circuits.

As an illustrative example, and not for the purpose of limitation, an integrated circuit may be configured to utilize one driver strength test circuit to test multiple pads, e.g., utilizing one driver strength test circuit to test multiple pads of like type. Such a configuration is represented schematically in FIG. 7 by Pad 2 and Pad 3, which are both tested by Test 2. As shown in FIG. 7, ATE 702 electrically communicates with the test circuitry of integrated circuit 710 by utilizing a variety of transmission path configurations. For example, circuitry 730 communicates with the ATE via transmission path 732, pad 712 and transmission path 792; circuitry 740 communicates with the ATE via transmission path 742, pad 714 and transmission path 794; circuitry 750 communicates with the ATE via transmission path 752, pad 718 and transmission path 796; circuitry 760 communicates with the ATE via transmission path 762, pad 718 and transmission path 796; circuitry 770 communicates with the ATE via transmission path 774, pad 722 and transmission path 798; and circuitry 780 communicates with the ATE via transmission path 782, pad 722 and transmission path 798. Additionally, various functionality may be enabled by control system 810 (described in detail hereinafter).

As described hereinbefore, the present invention is adapted to facilitate automated test equipment functionality for testing integrated circuits. In this regard, some embodiments of the present invention may be construed as providing driver strength test systems for testing integrated circuits. More specifically, some embodiments of the driver strength test system may include one or more driver strength test circuits in combination with ATE, e.g., ATE 702 of FIG. 7, and a suitable control system, which may be implemented by control system 810 of FIG. 7, for example. The control system may be implemented in hardware, software, firmware, or a combination thereof. In some embodiments, however, the control system is implemented as a software package, which can be adaptable to run on different platforms and operating systems as shall be described further herein. In particular, a preferred embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer-readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 8:
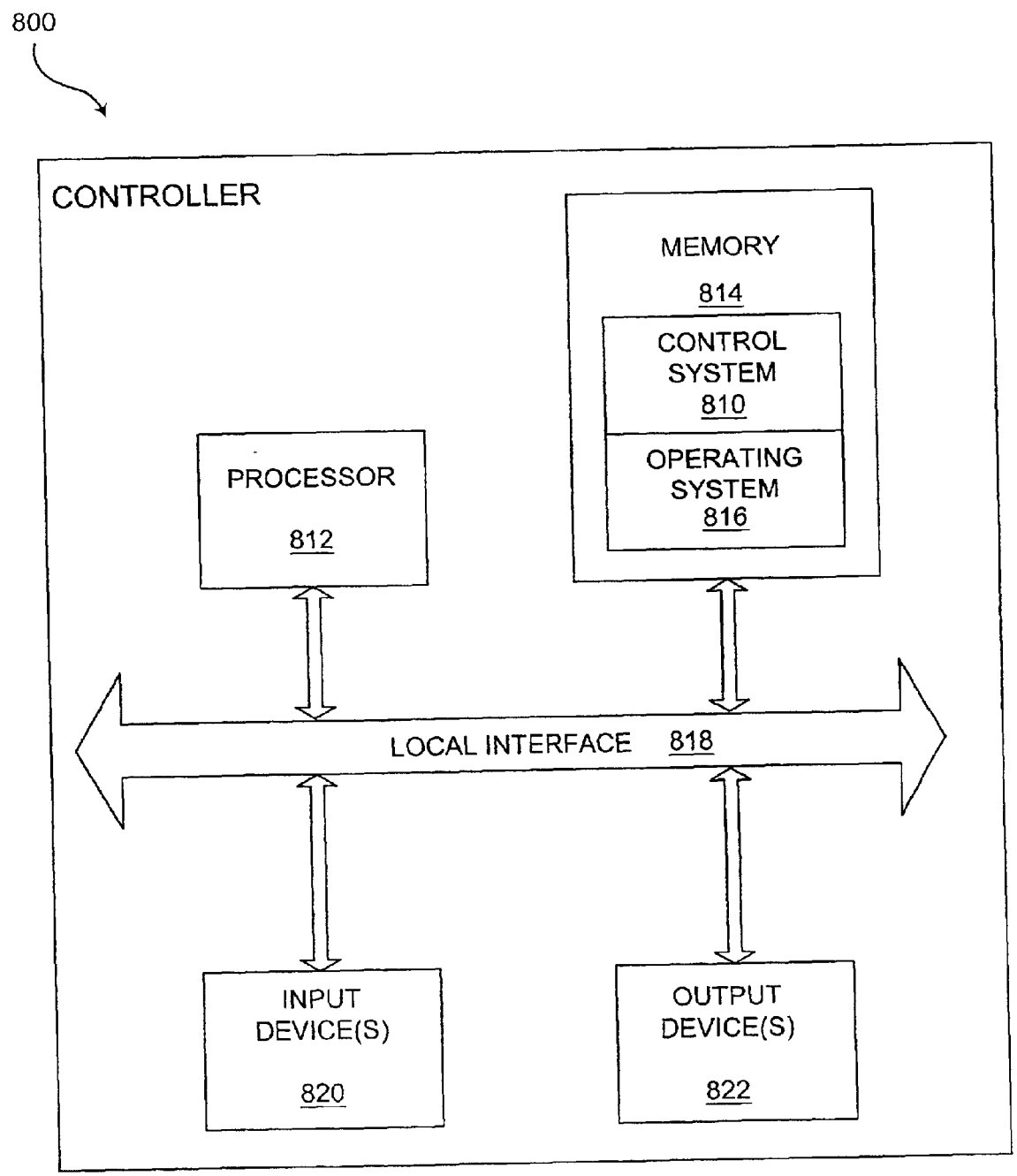
FIG. 8 is a schematic diagram depicting a representative computer or processor-based system which may be used to implement an embodiment of a control system of the present invention.

FIG. 8 illustrates a typical computer or processor-based system that may facilitate functionality of the control system 810 (described in detail hereinafter) of the present invention, and thereby may be employed as a controller, e.g., control system 810 of FIG. 7. As shown in FIG. 8, the computer system generally comprises a processor 812 and a memory 814 with an operating system 816. Herein, the memory 814 may be any combination of volatile and nonvolatile memory elements, such as random access memory or read only memory. The processor 812 accepts instructions and data from memory 814 over a local interface 818, such as a bus(es). The system also includes an input device(s) 820 and an output device(s) 822. Examples of input devices may include, but are not limited to, a serial port, a scanner, or a local access network connection. Examples of output devices may include, but are not limited to, a video display, a Universal Serial Bus, or a printer port. The control system 810 of the present invention, the functions of which shall be described hereinafter, resides in memory 814 and is executed by the processor 812.

Figure 9:
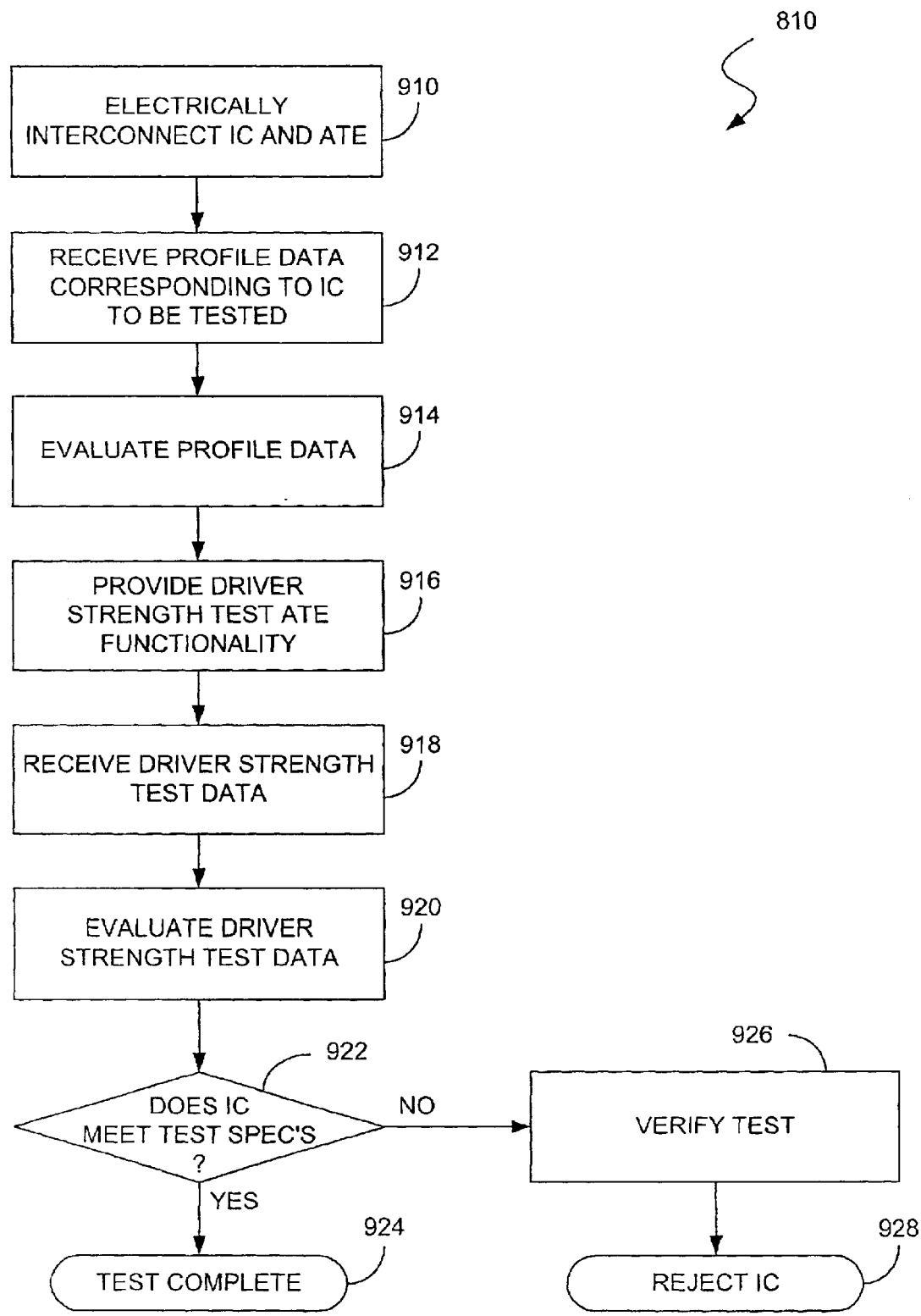
FIG. 9 is a flowchart depicting the functionality of an embodiment of the present invention.

The flowchart of FIG. 9 shows the functionality and operation of an implementation of the control system 810 depicted in FIG. 8. In this regard, each block of the flowchart represents a module segment or portion of code which comprises one or more executable instructions for implementing the specified logical function or functions. It should also be noted that in some alternative implementations the functions noted in the various blocks may occur out of the order depicted in FIG. 9. For example, two blocks shown in succession in FIG. 9 may, in fact, be executed substantially concurrently where the blocks may sometimes be executed in the reverse order depending upon the functionality involved.

As depicted in FIG. 9, the control system 810 (or method) may be construed as beginning at block 910 where an IC to be tested is electrically interconnected with ATE. Proceeding to block 912, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 914 where the data is evaluated, i.e., a determination is made as to whether testing may proceed.

At block 916, the IC under test is provided, by the ATE, with appropriate signals to facilitate driver strength testing. At block 918, test data is received, such as by the ATE, with the data being received in any suitable manner, e.g., intermittently throughout the testing cycle, or after testing has been completed. At block 920, where driver strength data is evaluated and, then, in block 922, a determination may be made as to whether the driver and its associated components are functioning as desired. If it is determined that the driver strength is not as desired, the process may proceed to block 926 where the test results may be verified, such as by repeating at least some of the aforementioned process steps 910–922. Thereafter, if the determination once again is made that the integrated circuit is not functioning as desired, the process may proceed to block 928 where the integrated circuit may be rejected. If, however, it is determined that the integrated circuit is functioning as desired, the process may proceed to block 924 where the process may terminate.

As is known, when ATE is used to test an integrated circuit, the ATE should be calibrated to ensure that it is providing accurate measurements. As the present invention provides at least selected ATE functionality, calibration of the driver strength test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 10:
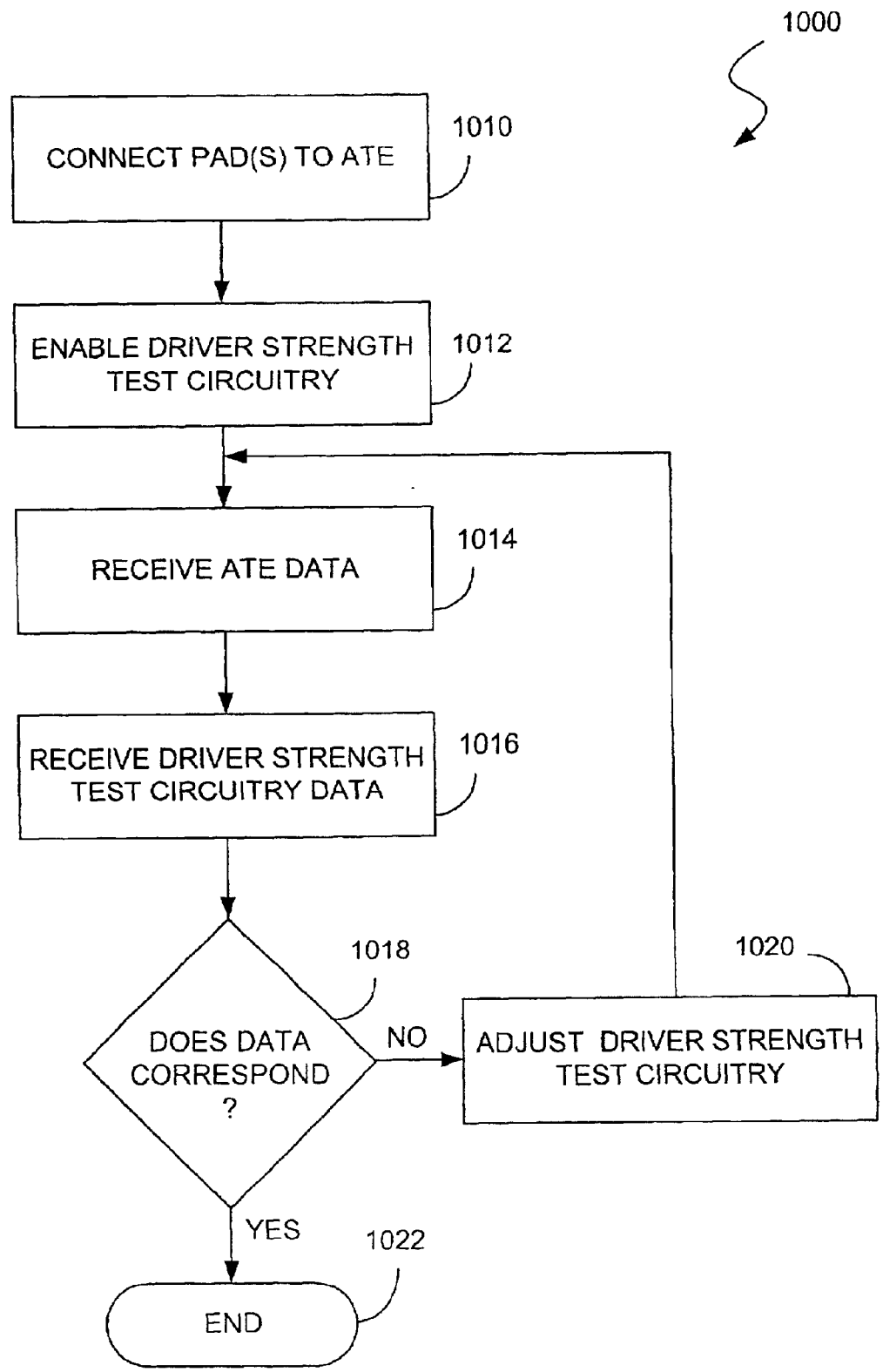
FIG. 10 is a flowchart depicting the functionality of an embodiment of the present invention during calibration.

Since, it is preferable to calibrate the driver strength test circuitry of the present invention, the following calibration method is provided for the purpose of illustration, and not for the purpose of limitation. As shown in FIG. 10, a method 1000 for calibrating driver strength test circuitry preferably begins at block 1010 where designated pads of an integrated circuit to be tested are connected to ATE. Preferably, when a circuit design, e.g., a pad, is used multiple times within an IC, identical driver strength test circuitry is associated with each instance of that circuit design. When so configured, connecting of the pads to the ATE, such as depicted in block 1010, preferably includes merely connecting the ATE to one or more instances of the circuit design. Since different instances of the repeated circuit design are assumed to be identical in their defect-free electrical behavior, measurements made on the ATE-connected instance of the circuit design may be assumed to correlate to the measurements made at other (non-connected) instances of that circuit design. It should be noted, however, that since each identical instance of the block is assumed to have identical defect-free electrical behavior, only one ATE-connected pad of each pad type need be utilized, although additional ones of the pads may be utilized for added error detection and comparison.

Proceeding to block 1012, driver strength test circuitry is enabled. With both ATE and the appropriate driver strength test circuitry now enabled, measurements may be taken by either or both of the ATE and the driver strength test circuitry. Thus, as depicted in blocks 1014 and 1016, the process includes the steps of receiving ATE measurements and receiving driver strength test circuitry measurements, respectively. At block 1018, a determination may be made as to whether the ATE measurement data and the driver strength test circuitry data appropriately correspond, thereby indicating proper calibration of the driver strength test circuitry. If, however, it is determined that the measurements do not correspond, the process may proceed to block 1020 where the receiver test circuitry measurements may be adjusted to match those measurements obtained from the ATE. Thereafter, the process may proceed back to block 1014 and proceed as described hereinbefore until the driver strength test circuitry measurements are appropriately calibrated. Once appropriate calibration has been achieved, the process may end, such as depicted in block 1022.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), the IC having a first pad configured as a signal interface for components external to the IC, the first pad having a driver, the driver being configured to provide an output signal to a component external to the IC, said method comprising:

electrically interconnecting automated test equipment (ATE) with the IC;

providing at least one stimulus such that the IC measures a driver strength of the first pad; and receiving information corresponding to the driver strength of the first pad.

2. The method of claim 1, wherein providing at least one stimulus comprises:

providing the at least one stimulus from the ATE.

3. The method of claim 1, wherein the pad has a receiver.

4. The method of claim 3, wherein the information received is captured by the receiver of the first pad.

5. The method of claim 1, wherein the IC has a second pad; and wherein providing at least one stimulus comprises:

electrically interconnecting the first pad with a second pad of the IC; and providing the at least one stimulus such that the IC measures a driver strength of the second pad.

6. The method of claim 1, wherein the IC has a plurality of pads, and wherein electrically interconnecting automated test equipment (ATE) with the IC comprises electrically interconnecting the ATE to a subset of the plurality of pads.

7. An integrated circuit (IC) comprising:

a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to the first pad input signal; and a first test circuit internal to said IC and being adapted to measure the driver strength of the first pad and provide information corresponding to the driver strength of the first pad.

8. The IC of claim 7, wherein said first test circuit is configured to receive at least one stimulus from automated test equipment (ATE) such that, in response thereto, said first test circuit provides a data signal to said driver of said first pad.

9. An integrated circuit (IC) comprising:

a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to said first pad input signal; and means for providing information corresponding to measuring the driver strength of the first pad.

* * * * *